(12) United States Patent
Ohta et al.

(10) Patent No.: US 7,960,188 B2
(45) Date of Patent: Jun. 14, 2011

(54) POLISHING METHOD

(75) Inventors: Shinrou Ohta, Tokyo (JP); Mitsuo Tada, Tokyo (JP); Noburu Shimizu, Tokyo (JP); Yoichi Kobayashi, Tokyo (JP); Taro Takahashi, Tokyo (JP); Eisaku Hayashi, Kanagawa (JP); Hiromitsu Watanabe, Tokyo (JP); Tatsuya Kohama, Tokyo (JP); Itsuki Kobata, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 12/465,024

(22) Filed: May 13, 2009

(65) Prior Publication Data

US 2009/0286332 A1    Nov. 19, 2009

(30) Foreign Application Priority Data

May 15, 2008 (JP) .................................. 2008-127811
Feb. 12, 2009 (JP) .................................. 2009-029993

(51) Int. Cl.
*H01L 21/00* (2006.01)
*H01L 21/302* (2006.01)
*G01R 31/26* (2006.01)

(52) U.S. Cl. ............ 438/10; 438/17; 438/691; 438/692; 257/752; 257/762; 257/E21.521; 257/E21.529; 257/E21.583; 324/230

(58) Field of Classification Search .................. 438/5, 7, 438/8, 10, 11, 691, 692
See application file for complete search history.

(56) References Cited

U.S. PATENT DOCUMENTS

| | | | |
|---|---|---|---|
| 6,663,469 B2 * | 12/2003 | Kimura et al. .................. | 451/41 |
| 6,811,466 B1 | 11/2004 | Swedek et al. | |
| 7,046,001 B2 | 5/2006 | Tada et al. | |
| 7,112,960 B2 | 9/2006 | Miller et al. | |
| 2005/0142991 A1 * | 6/2005 | Nakao et al. .................... | 451/64 |
| 2007/0020918 A1 * | 1/2007 | Hirokawa et al. ............. | 438/626 |
| 2008/0254714 A1 | 10/2008 | Torikoshi | |
| 2009/0277867 A1 * | 11/2009 | Mayer et al. .................... | 216/13 |

* cited by examiner

*Primary Examiner* — Hsien-ming Lee
(74) *Attorney, Agent, or Firm* — Wenderoff, Lind & Ponack, L.L.P.

(57) ABSTRACT

A method for polishing a substrate having a metal film thereon is described. The substrate has metal interconnects formed from part of the metal film. The polishing method includes performing a first polishing process of removing the metal film, after the first polishing process, performing a second polishing process of removing the barrier film, after the second polishing process, performing a third polishing process of polishing the insulating film. During the second polishing process and the third polishing process, a polishing state of the substrate is monitored with an eddy current sensor, and the third polishing process is terminated when an output signal of the eddy current sensor reaches a predetermined threshold.

4 Claims, 14 Drawing Sheets

POLISHING METHOD

BACKGROUND OF THE INVENTION

1. Field of the Invention

The present invention relates to a method of polishing a substrate having an interconnect-forming structure including a metal film, a barrier film, and an insulating film, and more particularly to a polishing method in which polishing of the substrate is terminated when the insulating film is removed by a predetermined thickness.

2. Description of the Related Art

In an interconnect formation process of a semiconductor wafer, a metal film is formed to provide interconnects and then chemical mechanical polishing (CMP) is performed to remove the excess metal film that is not used for the interconnects. In this polishing process, after the metal film is removed, a barrier film, underlying the metal film, is polished. Further, a hardmask film, underlying the barrier film, is polished. The polishing operation is terminated when the hardmask film reaches a predetermined thickness.

The hardmask film is an insulating film composed of an insulating material. This hardmask film is formed so as to cover an interlevel dielectric. The interlevel dielectric has an insulating property as well as the hardmask film, and is typically composed of a low-k material which is a brittle material. The purpose of forming the hardmask film is to protect this interlevel dielectric from physical processing by CMP.

FIG. 1 is a cross-sectional view showing an example of a multilayer structure for forming interconnects. As shown in FIG. 1, a hardmask film 903 is formed on an interlevel dielectric 902 which is composed of $SiO_2$ or low-k material. The hardmask film 903 is typically composed of $SiO_2$. Via holes 904 and trenches 905 are formed in both the hardmask film 903 and the interlevel dielectric 902 by a lithography etching technique or the like. Further, a barrier film 906, composed of metal such as Ta or TaN, is formed on surfaces of the hardmask film 903, the via holes 904, and the trenches 905 by sputtering or the like. Further, copper plating is performed on a substrate to fill the via holes 904 and the trenches 905 with copper to form a copper film 907 as a metal film on the barrier film 906.

Thereafter, chemical mechanical polishing (CMP) is performed to remove the copper film 907 and the barrier film 906. Polishing is terminated when the hardmask film 903 reaches a predetermined thickness, as indicated by a dotted line in FIG. 1, whereby the interconnects, composed of copper in the via holes 904 and the trenches 905, are formed.

The purpose of polishing the barrier film, which is a metal film, is to prevent short circuit between the interconnects. This is the same as the purpose of removing the metal film (i.e., the copper film 907). On the other hand, the purpose of polishing the hardmask film is to remove damaged portions or degenerated portions thereof resulting from the etching process that has been performed when forming the via holes and the trenches.

Furthermore, an interconnect resistance of the metal interconnects can be controlled by polishing the hardmask film. Specifically, when the barrier film is removed, separation between the interconnects is completed, whereby the short circuit will no longer occur. Therefore, the interconnects are formed at this stage. Polishing is further continued even after the formation of the interconnects so as to reduce cross sections of the interconnects to thereby change the interconnect resistance. This is because, when the hardmask film is polished, the metal interconnects is also polished simultaneously.

Management of the interconnect resistance is an important factor for device fabrication. That is, management of an amount of the hardmask film polished, i.e., a height of the metal interconnects, is very important in view of securing stability of a device. Therefore, highly accurate polishing end point detection is required in polishing of the hardmask film and the metal interconnects. For example, it is necessary to detect a polishing end point to an accuracy of a target thickness ±5 nm to ±10 nm.

Since the insulating film, such as the hardmask film and the interlevel dielectric, has a light transmission property, an optical means has been conventionally used as a film-thickness measuring method for the insulating film. However, both of the hardmask film and the interlevel dielectric may be formed by $SiO_2$ which can transmit light therethrough. In such a case, even if light is applied to the hardmask film during polishing thereof, it may be difficult to measure a film thickness due to an effect of the underlying interlevel dielectric. A failure in measuring of the film thickness results in a failure in terminating the polishing operation based on when the hardmask film reaches a predetermined thickness. Moreover, application of light to the metal interconnects, such as copper, can cause the metal of the interconnects to corrode. Such a phenomenon is called photo-corrosion.

SUMMARY OF THE INVENTION

The present invention has been made in view of the aforementioned conventional drawbacks. It is therefore an object of the present invention to provide a polishing method capable of terminating polishing of a substrate when an insulating film, e.g., a hardmask film, is removed by a desired amount and capable of removing metal interconnects accurately by a desired amount.

One aspect of the present invention is a method of polishing a substrate having an insulating film with trenches, a barrier film formed on the insulating film, and a metal film formed on the barrier film, part of the metal film forming metal interconnects in the trenches. The method includes performing a first polishing process of removing the metal film, after the first polishing process, performing a second polishing process of removing the barrier film, after the second polishing process, performing a third polishing process of polishing the insulating film, during the second polishing process and the third polishing process, monitoring a polishing state of the substrate with an eddy current sensor, and terminating the third polishing process when an output signal of the eddy current sensor reaches a predetermined threshold.

In a preferred aspect of the present invention, the threshold is a value given by subtracting a predetermined value from the output signal value of the eddy current sensor at a time of an end point of the second polishing process.

In a preferred aspect of the present invention, the predetermined value is a value of a variation in the output signal value of the eddy current sensor which corresponds to a predetermined amount of the insulating film to be polished.

In a preferred aspect of the present invention, the threshold is a value given by adding a predetermined value to the output signal value of the eddy current sensor at a time of an end point of polishing of an insulating film belonging to a level just beneath a level of the insulating film to be polished by the third polishing process.

In a preferred aspect of the present invention, the first polishing process, the second polishing process, and the third polishing process are each performed by holding the substrate with a substrate holder and pressing the substrate against a polishing surface of a polishing pad on a polishing table while rotating the substrate holder and the polishing table. The end point of the second polishing process is determined by monitoring the output signal value of the eddy current sensor and at least one of a temperature of the polishing surface, a torque current of the polishing table, and a torque current of the substrate holder.

In a preferred aspect of the present invention, the method further includes, during the second polishing process, monitoring the polishing state of the substrate with an optical sensor. The end point of the second polishing process is determined from changing points of the output signal value of the eddy current sensor and an output signal value of the optical sensor.

In a preferred aspect of the present invention, a selective ratio of slurry to be used as a polishing liquid in the first polishing process, the second polishing process, and the third polishing process is adjusted such that upper surfaces of the metal interconnects and an upper surface of the insulating film lie in the same plane when the third polishing process is terminated.

According to the present invention, the amount of the insulating film removed from the substrate can be accurately determined from the output signal value of the eddy current sensor which varies according to the height of the metal interconnects lying next to the insulating film. Therefore, by terminating the polishing operation when the output signal value of the eddy current sensor reaches the preset threshold, the insulating film (i.e., the metal interconnects) can be polished by a predetermined amount (thickness).

Another aspect of the present invention is a method of polishing a substrate having an insulating film with trenches, a barrier film formed on the insulating film, and a metal film formed on the barrier film, part of the metal film forming metal interconnects in the trenches. The method includes performing a first polishing process of removing the metal film, after the first polishing process, performing a second polishing process of removing the barrier film, after the second polishing process, performing a third polishing process of polishing the insulating film, after the third polishing process, performing a measuring process of measuring a height of the metal interconnects with an eddy current sensor, and performing an adjusting process of adjusting a polishing time for a subsequent substrate based on a measurement obtained by the measuring process.

In a preferred aspect of the present invention, the measuring process comprises measuring the height of the metal interconnects in a predetermined area of a polished surface of the substrate with the eddy current sensor.

In a preferred aspect of the present invention, the measuring process is performed in a measuring station provided separately from a polishing section in which the first through third polishing processes are performed.

In a preferred aspect of the present invention, the adjusting process comprises adjusting the polishing time for the second polishing process and/or the third polishing process of the subsequent substrate based on the measurement obtained by the measuring process.

In a preferred aspect of the present invention, the adjusting process comprises subtracting a predetermined target value from the measurement to determine a difference between the measurement and the target value, determining an adjustment time by dividing the difference by a removal rate, and adding the adjustment time to a preset polishing time.

According to the present invention, because the output signal value of the eddy current sensor varies according to the height of the metal interconnects lying next to the insulating film (e.g., a hardmask film or an interlevel dielectric), the height of the metal interconnects can be determined from the output signal value of the eddy current sensor. Moreover, by adjusting the polishing time of the subsequent substrate based on the height of the metal interconnects measured, an accuracy of a polishing end point of the subsequent substrate can be improved.

DETAILED DESCRIPTION OF THE PREFERRED EMBODIMENTS

Embodiments of the present invention will be described below with reference to the drawings.

Figure 1:
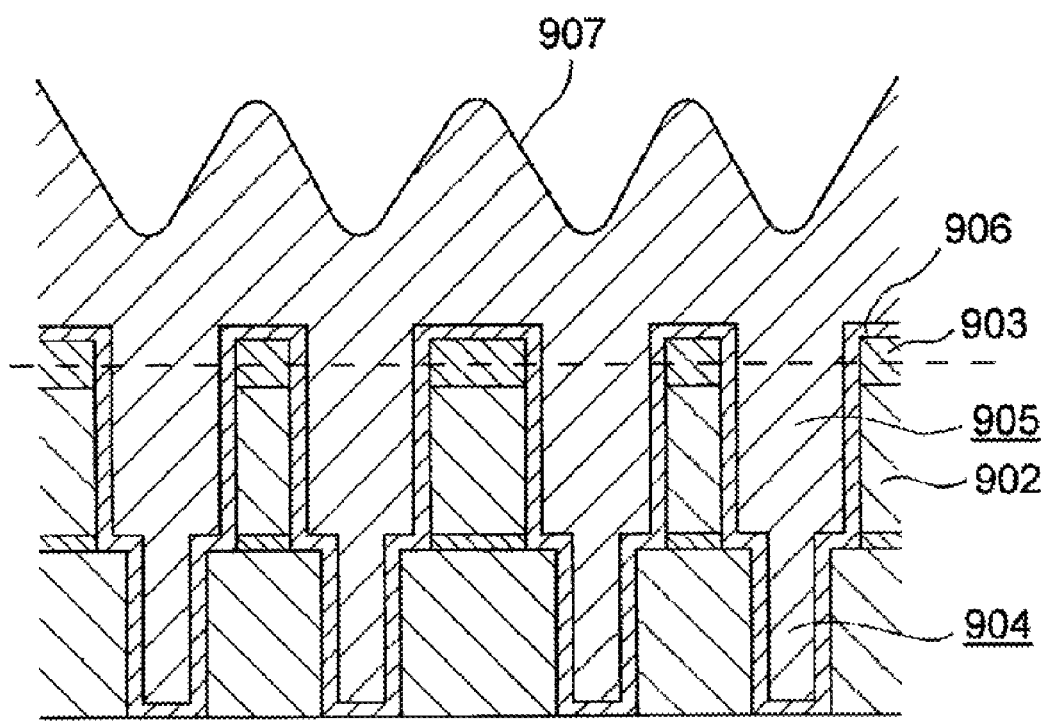
FIG. 1 is a cross-sectional view showing an example of an interconnect-forming structure.
Figure 2:
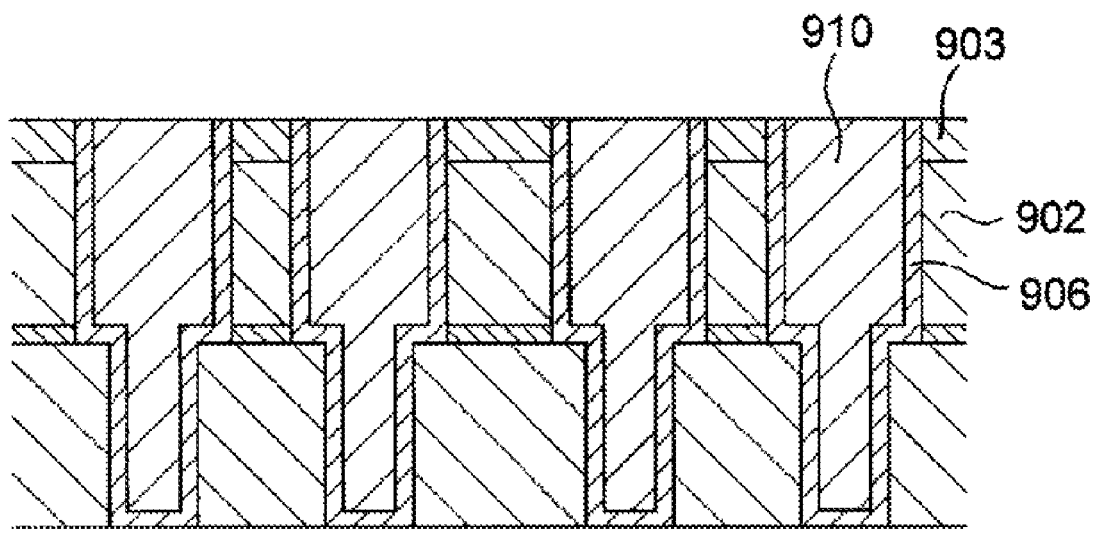
FIG. 2 is a schematic view showing a cross section of the interconnect-forming structure shown in FIG. 1 when being polished.

FIG. 2 is a schematic view showing a cross section of the interconnect-forming structure shown in FIG. 1 when being polished. More specifically, FIG. 2 shows the cross section in which the barrier film on the hardmask film (i.e., the insulating film) 903 has been removed and the hardmask film 903 and the copper (i.e., the metal interconnects) 910 in the trenches are being polished.

In polishing of the hardmask film (which is an insulating film), an eddy current sensor is used to measure a film thickness and detect a polishing end point. Since the hardmask film lies next to the metal interconnects, the hardmask film and the metal interconnects are polished simultaneously. Therefore, an output signal value of the eddy current sensor changes when the hardmask film is being polished. This means that there is an interrelation between the thickness of the hardmask film and the height of the metal interconnects (or cross section of each interconnect). In other words, there is an interrelation between an amount of the hardmask film removed and an amount of change in the output signal value of the eddy current sensor. In this specification, the amount of the removed hardmask film is expressed as a decrease in the thickness thereof from its initial thickness.

From this basis, the inventors have found the fact that the output signal value of the eddy current sensor changes during polishing of the hardmask film, although it is a smaller change than that during polishing of a metal film. Thus, this embodiment utilizes the change in the height (the cross sectional shape) of the metal interconnects, lying next to the hardmask film, to indirectly measure the thickness of the hardmask film which is an insulating film.

Figure 3:
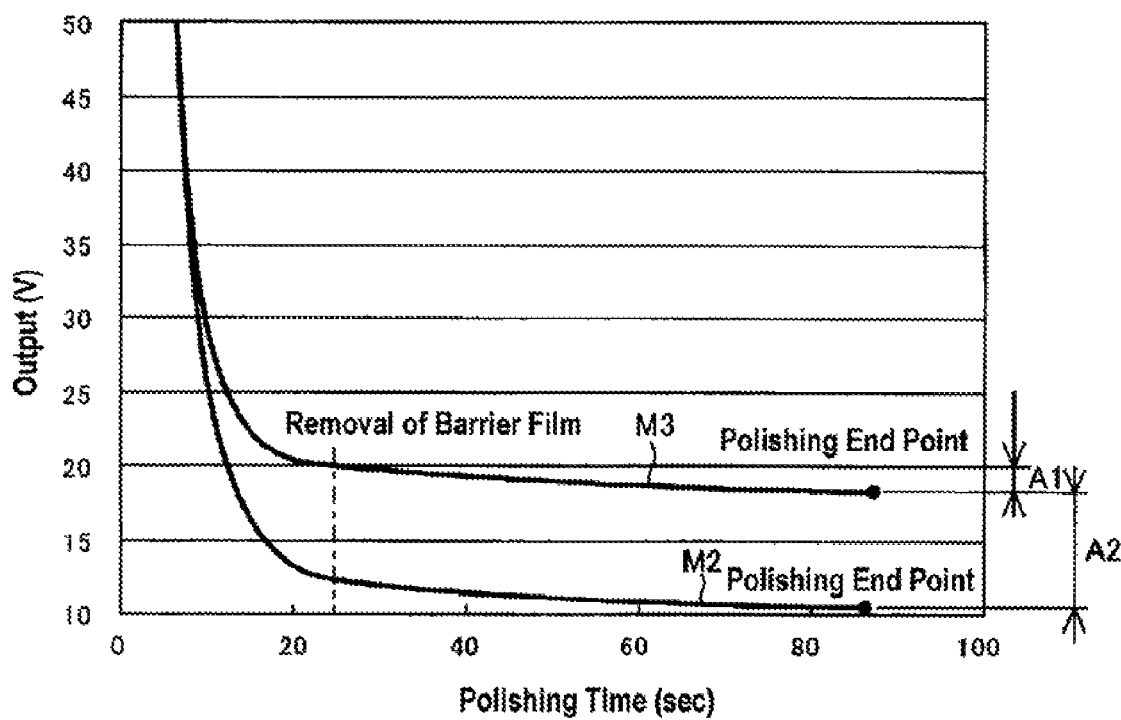
FIG. 3 is a graph showing a variation in output signal value of an eddy current sensor when a barrier film and a hardmask film of the interconnect-forming structure shown in FIG. 1 are being polished.

FIG. 3 is a graph showing a variation in the output signal value of the eddy current sensor when the barrier film and the hardmask film of the interconnect-forming structure shown in FIG. 1 are being polished. In FIG. 3, a symbol "M2" indicates the output signal of the eddy current sensor when polishing the interconnect-forming structure that belongs to a second level, and a symbol "M3" indicates the output signal of the eddy current sensor when polishing the interconnect-forming structure that belongs to a third level lying over the second level. In this graph, the output signal value of the eddy current sensor during a polishing operation that is from polishing of the barrier film (metal barrier film) is shown.

As can be seen from the graph in FIG. 3, after about 20 seconds have elapsed from a polishing start, the variation in the output signal value of the eddy current sensor becomes less steep. This indicates removal of the barrier film. It can also be seen that, as the polishing operation further proceeds, the output signal value of the eddy current sensor decreases gently. This indicates that the metal interconnects are being polished together with the hardmask film. In this embodiment, the management of the polishing end point and the thickness of the hardmask film is conducted using the change in the output signal value of the eddy current sensor obtained when polishing the hardmask film. Specifically, based on the output signal value of the eddy current sensor, the polishing operation is terminated when the insulating film, such as the hardmask film, is polished by a desired amount.

More specifically, when the output signal value of the eddy current sensor reaches a predetermined threshold, polishing of the substrate is terminated. As shown in FIG. 3, this threshold is a value that is smaller by a value A1 than the output signal value at the time of removal of the barrier film. This value A1 is a value of a variation in the output signal value of the eddy current sensor which corresponds to a predetermined amount of the removed hardmask film. The value A1 is determined in advance from the interrelation between the amount of the removed hardmask film and the variation in the output signal value of the eddy current sensor.

In general, an interconnect density differs from substrate to substrate. Consequently, the output signal value of the eddy current sensor can differ depending on the interconnect density. Specifically, where the eddy current sensor has the same sensitivity, the output signal value of the eddy current sensor when measuring a substrate with a low interconnect density varies relatively gently. On the other hand, the output signal value of the eddy current sensor when measuring a substrate with a high interconnect density varies relatively sharply.

Thus, if the interconnect density of a substrate (a polishing target) is known, the output signal value of the eddy current sensor or the sensitivity of the eddy current sensor can be corrected or calibrated by using a known interrelation between the interconnect density and the output signal value of the eddy current sensor. By conducting this calibration, the variation in the output signal of the eddy current sensor can be determined with the same scale (i.e., normalized scale), without depending on the interconnect density of the substrate.

The normalization of scale enables collection of normalized data, and an increase in the data contributes to a stable polishing process.

Figure 4:
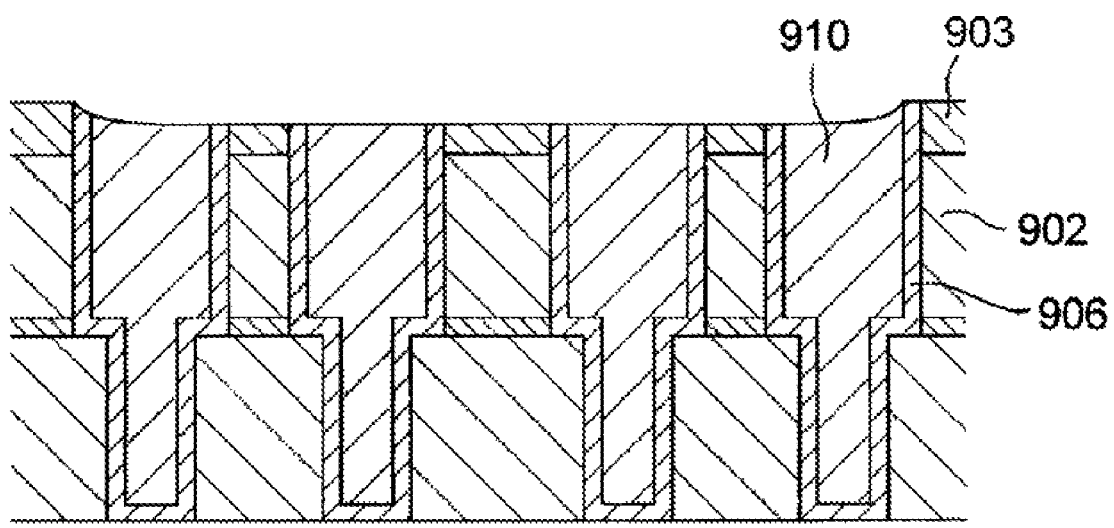
FIG. 4 is a cross-sectional view showing a recess, which is called erosion, formed on a polished surface.

As the polishing process proceeds, a recess, which is called erosion, may be formed on a polished surface, as shown in FIG. 4. In this case, the hardmask film remains outwardly of the recess. However, a target to be measured by the eddy current sensor is the height of the interconnects (i.e., the cross section of each interconnects). Therefore, in the management of the height of the interconnects, the output signal value of the eddy current sensor can be used as it is, without considering the effects of the erosion.

The erosion may affect subsequent interconnect-forming processes. Thus, it is preferable to adjust a selection ratio of slurry (a polishing liquid) in the polishing processes from polishing of the metal film to polishing of the hardmask film such that an upper surface of the hardmask film and upper surfaces of the interconnects lie in the same plane at the time of polishing end of the hardmask film.

As described above, the output signal value of the eddy current sensor is affected by the interconnect density. Therefore, it is preferable to correct the output signal value of the eddy current sensor according to the interconnect density, or change the threshold according to the interconnect density by multiplying the threshold by a coefficient that is proportional to the interconnect density. Further, in a case where the variation in the output signal value of the eddy current sensor is stable and repeatability thereof is secured to a certain degree, the polishing end point can be determined by calculating a differential value of the output signal value of the eddy current sensor.

Although the graph in FIG. 3 shows the output signal value that begins at the barrier film polishing stage, an actual polishing process is started from polishing of the metal film (e.g., copper or tungsten) on the barrier film. Therefore, a polishing process of a substrate can be divided roughly into three processes: a metal film polishing process (a first polishing process), a barrier film polishing process (a second polishing process), and a hardmask film polishing process (a third polishing process).

An end point of the second polishing process is a point where the variation in the output signal value of the eddy current sensor becomes gentle. For example, a point of time when a differential value of the output signal value of the eddy current sensor reaches a predetermined value can be set to the end point of the second polishing process. However, as shown in FIG. 3, it is not always possible to clearly determine a changing point from the second polishing process to the third polishing process. Thus, it is preferable to measure a temperature of a polishing surface of a polishing pad, a torque current of a polishing table, or a torque current of a top ring, and determine the removal point of the barrier film based on the measurement result and the output signal value of the eddy current sensor. For example, when the barrier film is removed and the hardmask film is exposed, friction between the polishing pad and the substrate is changed. As a result, the temperature of the polishing surface of the polishing pad is also changed. Structure of a polishing apparatus including the polishing pad, the polishing table, and top ring will be described later.

After the barrier film, composed of metal, is removed, light can be applied to the insulating film underlying the barrier film. Therefore, in addition to the eddy current sensor, an optical sensor may be used. In this case, the output signals of the eddy current sensor and the optical sensor can be used to determine the end point of the second polishing process.

Next, steps of determining the threshold of the polishing end point will be described.

At an initial stage of the polishing process, the interrelation between the thickness of the hardmask film and the output signal value of the eddy current sensor is unknown. Thus, the interrelation between the amount of the removed hardmask film and the variation in the output signal value of the eddy current sensor is quantified as follows.

At step 1, at least one substrate having a hardmask film with different thicknesses is prepared. This substrate to be prepared may be a single substrate having a hardmask film with different thicknesses as a result of multiple polishing thereof, or may be plural substrates each having a hardmask film with a different thickness. The substrate to be prepared is a substrate having a known interconnect density. The hardmask film may belong to a first level, a second level, or other level.

In the following descriptions, three substrates are prepared. These substrates have hardmask films which have been polished by amounts of 10 nm, 30 nm, and 50 nm, respectively. These values 10 nm, 30 nm, and 50 nm are each an amount of the hardmask film removed (i.e., a decrease in thickness from its initial thickness).

At step 2, a height of interconnects, lying next to the hardmask film, is measured by the eddy current sensor, so that output signal values of the eddy current sensor at the removal amounts 10 nm, 30 nm, and 50 nm are obtained.

Next, at step 3, an actual thickness of each hardmask film is measured, so that actual amounts of the removed hardmask films are obtained. This measuring operation may be performed by a cross section measuring technique using SEM (Scanning Electron Microscope), or may be performed using OCD (Optical Critical Dimension) to optically measure a width of the interconnects of fine patterns. Unlike SEM that is the cross section measuring technique, OCD is a non-destructive inspection. Therefore, use of OCD can reduce substrates to be scrapped, and contributes to improvement of productivity. When using OCD, only a single substrate is prepared.

At step 4, the actual amount of the hardmask film removed (the decrease in thickness from the initial thickness) is associated with the corresponding variation in the output signal value of the eddy current sensor, whereby the interrelation between the amount of the hardmask film removed and the variation in the output signal value of the eddy current sensor is quantified. There are, of course, cases where the amount of the hardmask film removed is not 30 nm or 50 nm. Even in such cases, by quantifying the interrelation between the amount of the hardmask film removed and the variation in the output signal value of the eddy current sensor, the amount of the hardmask film removed can be determined continuously from the output signal value of the eddy current sensor.

At step 5, the value A1, which is the variation in the output signal value of the eddy current sensor corresponding to a desired amount of the hardmask film to be removed, is determined.

At step 6, the repeatability of the interrelation between the amount of the hardmask film removed and the variation in the output signal value of the eddy current sensor is examined. When the repeatability is obtained, a product substrate (i.e., an object of polishing) is polished. On the other hand, when the repeatability is not obtained, the process flow goes back to step 2.

Polishing of the substrate is performed while monitoring a polishing state by the eddy current sensor. Removing of the metal film (i.e., the first polishing process), removing of the barrier film (i.e., the second polishing process), and polishing of the hardmask film (i.e., the third polishing process) are performed successively. A threshold for the polishing end point is determined by subtracting the value A1 from the output signal value of the eddy current sensor at the time of removal of the barrier film. Polishing of the substrate is terminated when the output signal value of the eddy current sensor reaches the threshold.

As can be seen from FIG. 3, the output signal (M2), indicating polishing of the interconnect-forming structure in the second level, has substantially the same graph shape as the output signal (M3) indicating polishing of the interconnect-forming structure in the third level. It can be understood from these graphs that the output signal values obtained when polishing the second level and the third level in the same substrate show substantially the same downward trend.

Utilizing this fact, it is possible to determine a threshold by adding a predetermined value A2 to the output signal value of the eddy current sensor at the time of polishing end of a lower level and stop the polishing operation when the output signal value of the eddy current sensor reaches this threshold, as shown in FIG. 3. In this case also, the value A2 is determined using at least one sample substrate, prior to polishing of the product substrate. This polishing end point detection method can prevent excessive polishing of the hardmask film, because it uses the polishing result of the lower level.

Figure 5:
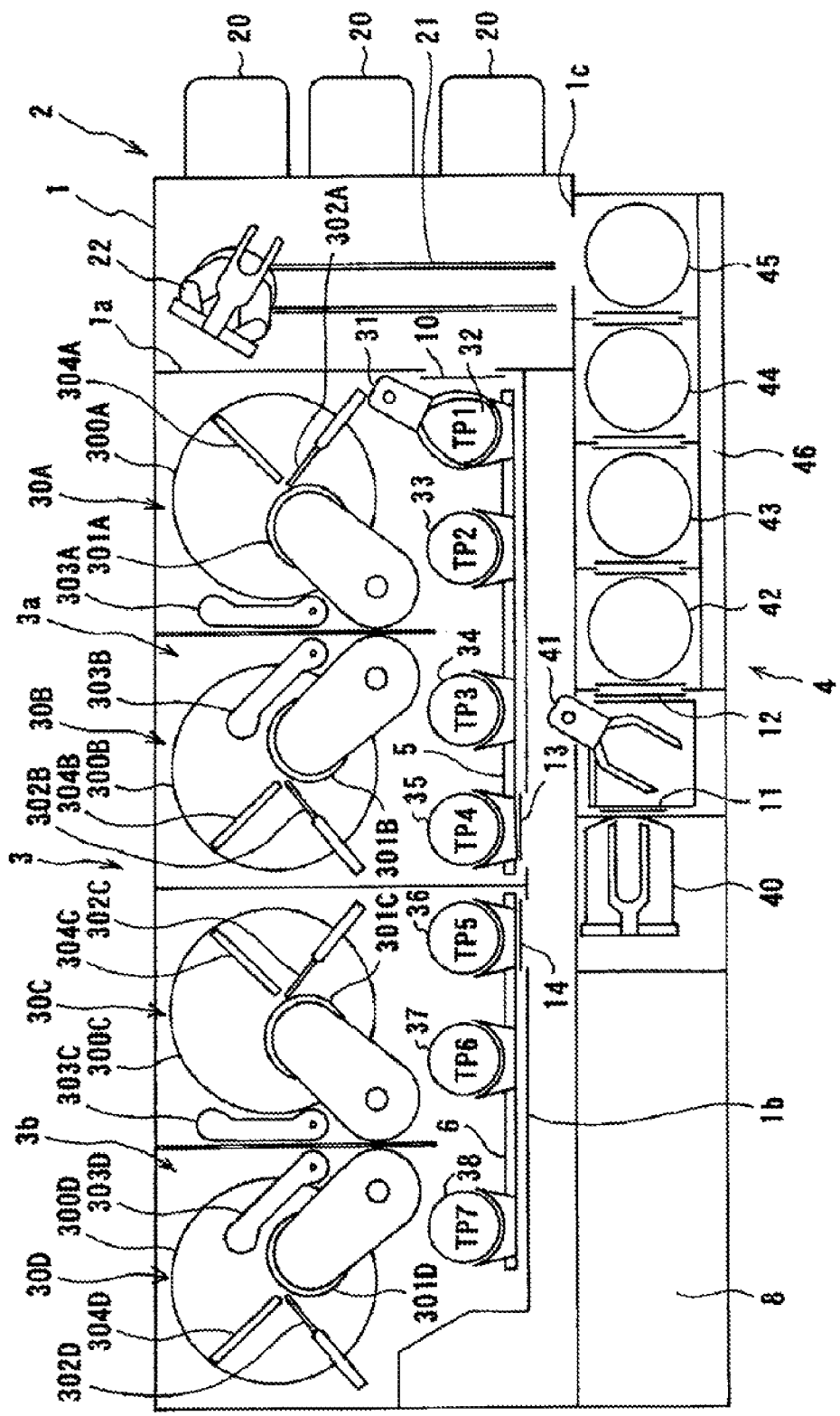
FIG. 5 is a plan view showing a whole arrangement of a polishing apparatus.
Figure 6:
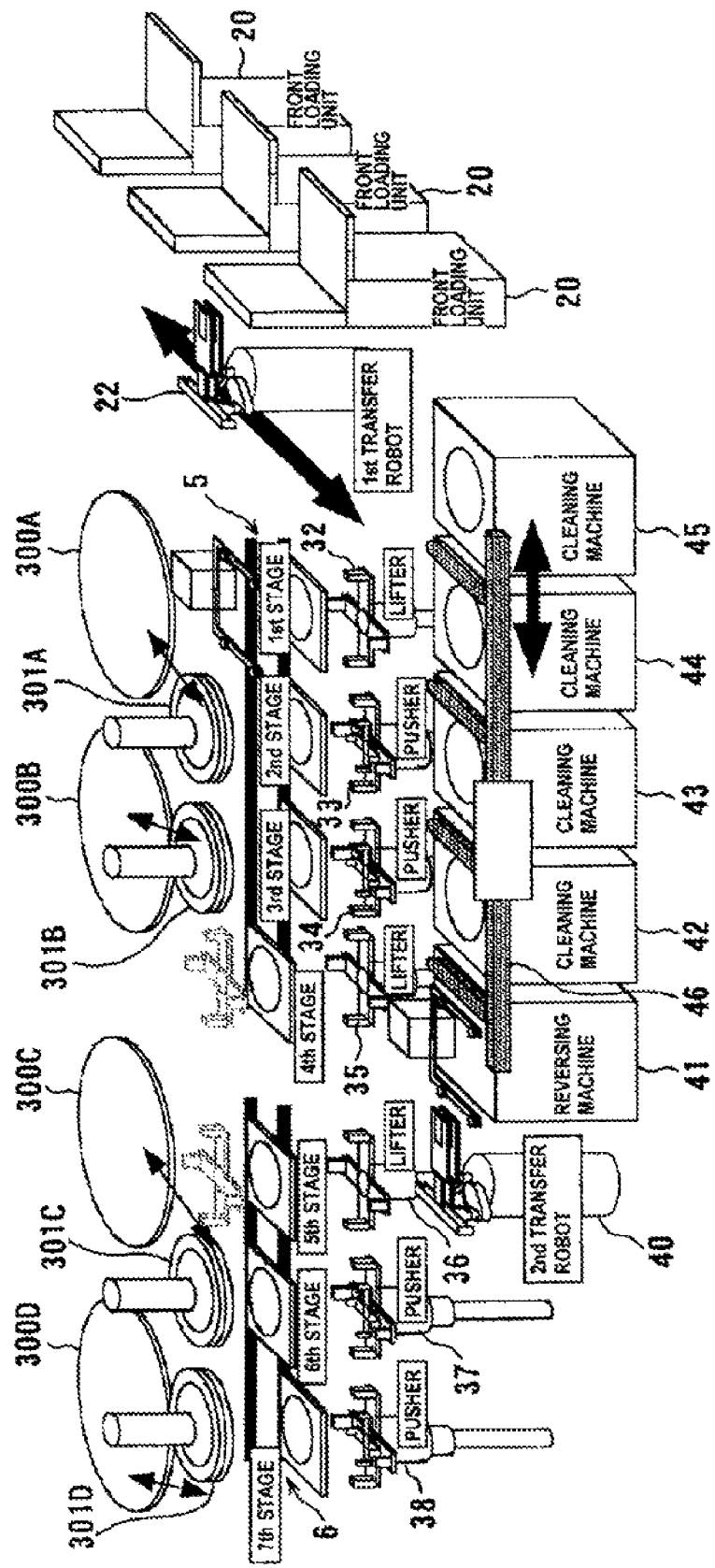
FIG. 6 is a perspective view showing an outline of the polishing apparatus shown in FIG. 5.

Next, a polishing apparatus for performing the above-described polishing method will be described with reference to the drawings. FIG. 5 is a plan view showing a whole arrangement of the polishing apparatus, and FIG. 6 is a perspective view showing an outline of the polishing apparatus shown in FIG. 5. As shown in FIG. 5, the polishing apparatus has a housing 1 in a rectangular shape. An interior space of the housing 1 is divided into a loading-unloading section 2, a polishing section 3 (3a, 3b), and a cleaning section 4 by partition walls 1a, 1b, and 1c.

The loading-unloading section 2 has two or more front loading units 20 (three in FIG. 5) on which wafer cassettes, each storing plural substrates, are placed. The front loading units 20 are arranged adjacent to each other along a width direction of the polishing apparatus (a direction perpendicular to a longitudinal direction of the polishing apparatus). Each of the front loading units 20 can receive thereon an open cassette, an SMIF (Standard Manufacturing Interface) pod, or a FOUP (Front Opening Unified Pod). The SMIF and FOUP are hermetically sealed containers which house a wafer cassette therein and cover it with a partition wall to thereby provide interior environments isolated from an external space.

The loading-unloading section 2 has a moving mechanism 21 extending along an arrangement direction of the front loading units 20. A transfer robot 22 is installed on the moving mechanism 21 and is movable along the arrangement direction of the front loading units 20. This transfer robot 22 is configured to move on the moving mechanism 21 so as to access the wafer cassettes mounted on the front loading units 20. The transfer robot 22 has vertically arranged two hands, which are separately used. For example, the upper hand can be used for returning a polished substrate to the wafer cassette, and the lower hand can be used for transferring a non-polished substrate.

The loading-unloading section 2 is required to be a cleanest area. Therefore, pressure in the interior of the loading-unloading section 2 is kept higher at all times than pressures in the exterior space of the apparatus, the polishing section 3, and the cleaning section 4. Further, a filter fan unit (not shown in the drawings) having a clean air filter, such as HEPA filter or ULPA filter, is provided above the moving mechanism 21 of the first transfer robot 22. This filter fan unit removes particles, toxic vapor, and toxic gas from air to produce clean air, and forms downward flow of the clean air at all times.

The polishing section 3 is an area where a substrate is polished. This polishing section 3 includes a first polishing section 3a having a first polishing unit 30A and a second polishing unit 30B therein, and a second polishing section 3b having a third polishing unit 30C and a fourth polishing unit 30D therein. As shown in FIG. 5, the first polishing unit 30A, the second polishing unit 30B, the third polishing unit 30C, and the fourth polishing unit 30D are arranged along the longitudinal direction of the polishing apparatus.

The first polishing unit 30A includes a polishing table 300A supporting a polishing pad, a top ring 301A for holding a substrate and pressing the substrate against a polishing surface of the polishing pad on the polishing table 300A so as to polish the substrate, a polishing liquid supply nozzle 302A for supplying a polishing liquid (e.g., slurry) or a dressing liquid (e.g., pure water) onto the polishing pad, a dresser 303A for dressing the polishing pad, and an atomizer 304A having one or more nozzles for ejecting a mixture of a liquid (e.g., pure water) and a gas (e.g., nitrogen) in an atomized state onto the polishing surface of the polishing pad.

Similarly, the second polishing unit 30B includes a polishing table 300B, a top ring 301B, a polishing liquid supply nozzle 302B, a dresser 303B, and an atomizer 304B. The third polishing unit 30C includes a polishing table 300C, a top ring 301C, a polishing liquid supply nozzle 302C, a dresser 303C, and an atomizer 304C. The fourth polishing unit 30D includes a polishing table 300D, a top ring 301D, a polishing liquid supply nozzle 302D, a dresser 303D, and an atomizer 304D.

A first linear transporter 5 is provided in the first polishing section 3a. This first linear transporter 5 is for transferring a substrate between four transferring positions located along the longitudinal direction of the polishing apparatus (hereinafter, these four transferring positions will be referred to as a first transferring position TP1, a second transferring position TP2, a third transferring position TP3, and a fourth transferring position TP4 in the order from the loading-unloading section 2). A reversing machine 31 for reversing a substrate transferred from the first transfer robot 22 of the loading-unloading section 2 is disposed above the first transferring position TP1 of the first linear transporter 5, and a vertically movable lifter 32 is disposed below the first transferring position TP1. A vertically movable pusher 33 is disposed below the second transferring position TP2, a vertically movable pusher 34 is disposed below the third transferring position TP3, and a vertically movable lifter 35 is disposed below the fourth transferring position TP4.

In the second polishing section 3b, a second linear transporter 6 is disposed adjacent to the first linear transporter 5. This second linear transporter 6 is for transferring a substrate between three transferring positions located along the longitudinal direction of the polishing apparatus (hereinafter, these three transferring positions will be referred to as a fifth transferring position TP5, a sixth transferring position TP6, and a seventh transferring position TP7 in the order from the loading-unloading section 2). A vertically movable lifter 36 is disposed below the fifth transferring position TP5 of the second linear transporter 6, a pusher 37 is disposed below the sixth transferring position TP6, and a pusher 38 is disposed below the seventh transferring position TP7.

As shown in FIG. 6, the first linear transporter 5 has four transfer stages: a first transfer stage, a second transfer stage, a third transfer stage, and a fourth transfer stage. These stages are linearly movable in a reciprocating motion. These transfer stages have a two-line structure including an upper line and a lower line. Specifically, the first transfer stage, the second transfer stage, and the third transfer stage are arranged on the lower line, and the fourth transfer stage is arranged on the upper line.

The lower transfer stages and the upper transfer stage can freely move without interfering with each other because they are provided at different heights. The first transfer stage transfers a substrate between the first transferring position TP1 and the second transferring position (i.e., substrate receiving/delivering position) TP2. The second transfer stage transfers a substrate between the second transferring position TP2 and the third transferring position (i.e., substrate receiving/delivering position) TP3. The third transfer stage transfers a substrate between the third transferring position TP3 and the fourth transferring position TP4. The fourth transfer stage transfers a substrate between the first transferring position TP1 and the fourth transferring position TP4.

The second linear transporter 6 has substantially the same structure as the first linear transporter 5. Specifically, the fifth transfer stage and the sixth transfer stage are disposed on the upper line, and the seventh transfer stage is disposed on the lower line. The fifth transfer stage transfers a substrate between the fifth transferring position TP5 and the sixth transferring position (i.e., substrate receiving/delivering position) TP6. The sixth transfer stage transfers a substrate between the sixth transferring position TP6 and the seventh transferring position (i.e., substrate receiving/delivering position) TP7. The seventh transfer stage transfers a substrate between the fifth transferring position TP5 and the seventh transferring position TP7.

As can be understood from the fact that slurry is used during polishing, the polishing section 3 is the dirtiest area. Therefore, a gas is evacuated from surrounding spaces of the respective polishing tables so as to prevent particles from escaping out of the polishing section 3. Pressure in the interior of the polishing section 3 is set to be lower than pressures in the exterior of the apparatus, the cleaning section 4, and the loading-unloading section 2, whereby scattering of particles is prevented. Typically, discharge ducts (not shown in the drawings) are provided below the polishing tables, and filters (not shown in the drawings) are provided above the polishing tables, so that downward flows of clean air are formed from the filters to the discharge ducts.

The cleaning section 4 is an area where a polished substrate is cleaned. The cleaning section 4 includes a second transfer robot 40, a reversing machine 41 for reversing a substrate received from the second transfer robot 40, four cleaning devices 42-45 for cleaning a polished substrate, and a transfer unit 46 for transferring a substrate between the reversing machine 41 and the cleaning devices 42-45. The reversing machine 41 and the cleaning devices 42-45 are arranged in series along the longitudinal direction of the polishing apparatus. A filter fan unit (not shown in the drawings), having a clean air filter, is provided above the cleaning devices 42-45. This filter fan unit serves to remove particles from air to produce clean air, and to form downward flow of the clean air at all times. Further, pressure in the cleaning section 4 is kept higher than that in the polishing section 3, so that particles in the polishing section 3 is prevented from flowing into the cleaning section 4.

The transfer unit 46 has plural arms configured to grasp substrates. These arms are configured to transfer plural substrates horizontally and simultaneously between the reversing machine 41 and the cleaning devices 42-45. The first cleaning device 42 and the second cleaning device 43 may each comprise, for example, a roll type cleaning device which rotates upper and lower roll-shaped sponges and presses them against front and rear surfaces of a substrate to clean the front and rear surfaces of the substrate. The third cleaning device 44 may comprise, for example, a pencil type cleaning device which rotates a hemispherical sponge and presses it against a substrate to clean the substrate.

The fourth cleaning device 45 may comprise, for example, a pencil-type cleaning device which rinses and cleans a rear surface of a substrate and rotates a hemispherical sponge and presses it against a front surface of the substrate to clean the front surface. The fourth cleaning device 45 has a stage that chucks a substrate and rotates it at a high rotational speed, and thus has a function (spin-drying function) to dry a cleaned substrate by rotating the substrate at a high rotational speed. In the cleaning devices 42-45, a megasonic type cleaning device, which applies ultrasonic waves to a cleaning liquid to clean a substrate, may be provided in addition to the roll type cleaning device or the pencil type cleaning device described above.

A shutter 10 is disposed between the reversing machine 31 and the first transfer robot 22. When transferring the substrate, the shutter 10 is opened, so that the substrate is delivered between the first transfer robot 22 and the reversing machine 31. When the substrate is not transferred, the shutter 10 is closed. A shutter 11 is disposed between the reversing machine 41 and the second transfer robot 40. A shutter 12 is disposed between the reversing machine 41 and the first cleaning machine 42. A shutter 13 is disposed between the first polishing section 3a and the second transfer robot 40. A shutter 14 is disposed between the second polishing section 3b and the second transfer robot 40. When transferring the substrate, the shutters 11, 12, 13, and 14 are opened, so that the substrate is delivered. Substrate processing operations including transferring, polishing, cleaning, and drying of a substrate are controlled by a controller 8.

Figure 7:
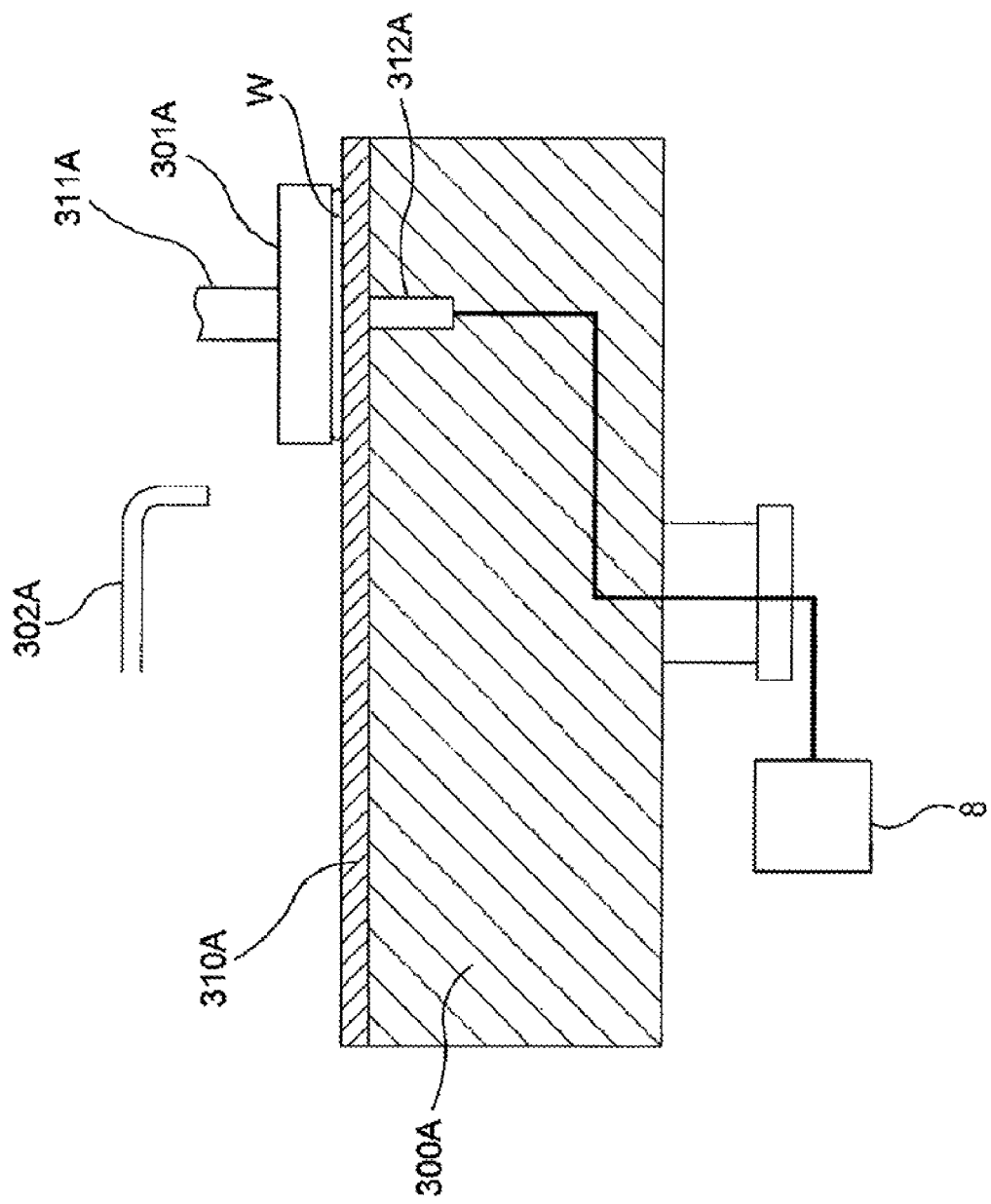
FIG. 7 is a schematic view showing structure of a first polishing unit.

FIG. 7 is a schematic view showing structure of the first polishing unit 30A. As shown in FIG. 7, a polishing pad 310A is mounted on the polishing table 300A. The polishing table 300A is coupled to a motor (not shown in the drawing) disposed therebelow, and is rotatable about its own axis. The top ring 301A is coupled to a top ring shaft 311A, which is coupled to a motor and an elevating cylinder (not shown in the drawing). The top ring 301A can thus be vertically moved and rotated about the top ring shaft 311A. The substrate to be polished is attracted to and held on a lower surface of the top ring 301A by a vacuum suction or the like. The upper surface of the polishing pad 310A provides the polishing surface for use in sliding contact with the substrate.

The substrate, held on the lower surface of the top ring 301A, is rotated and pressed by the top ring 301A against the polishing surface of the polishing pad 310A on the rotating polishing table 300A. The polishing liquid is supplied from a polishing liquid supply nozzle 302A onto the polishing surface of the polishing pad 310A. The substrate is thus polished in the presence of the polishing liquid between the surface (lower surface) of the substrate and the polishing pad 310A. The polishing table 300A and the top ring 301A constitute a mechanism for providing relative movement between the substrate W and the polishing surface.

An eddy current sensor 312A is embedded in the polishing table 300A. This eddy current sensor 312A is configured to supply a high-frequency alternating current to a sensor coil so as to induce an eddy current in a conductive film to thereby measure a thickness of the conductive film based on a change in impedance caused by a magnetic field of the eddy current induced. The eddy current sensor 312A sends a signal indicating the film thickness of the substrate W to the controller 8. The controller 8 receives the output signal of the eddy current sensor 312A, and detects the polishing end point according to the above-described method. Upon detecting the polishing end point, the controller 8 stops the polishing operation of the first polishing unit 30A. The second polishing unit 30B, the third polishing unit 30C, and the fourth polishing unit 30D have the same structures as the first polishing unit 30A, and the details thereof are not described.

The polishing apparatus having the above structures can perform series processing in which a substrate is successively polished in the four polishing units and can also perform parallel processing in which two substrates are polished simultaneously.

When series processing is performed, a substrate is transferred on the following route: the wafer cassette of the front loading unit 20→the first transfer robot 22→the reversing machine 31→the lifter 32→the first transfer stage of the first linear transporter 5→the pusher 33→the top ring 301A→the polishing table 300A→the pusher 33→the second transfer stage of the first linear transporter 5→the pusher 34→the top ring 301B→the polishing table 300B→the pusher 34→the third transfer stage of the first linear transporter 5→the lifter 35→the second transfer robot 40→the lifter 36→the fifth transfer stage of the second linear transporter 6→the pusher 37→the top ring 301C→the polishing table 300C→the pusher 37→the sixth transfer stage of the second linear transporter 6→the pusher 38→the top ring 301D→the polishing table 300D→the pusher 38→the seventh transfer stage of the second linear transporter 6→the lifter 36→the second transfer robot 40→the reversing machine 41→the transfer unit 46→the first cleaning device 42→the transfer unit 46→the second cleaning device 43→the transfer unit 46→the third cleaning device 44→the transfer unit 46→the fourth cleaning device 45→the first transfer robot 22→the wafer cassette of the front loading unit 20.

When parallel processing is performed, a substrate is transferred on the following route: the wafer cassette of the front loading unit 20→the first transfer robot 22→the reversing machine 31→the lifter 32→the first transfer stage of the first linear transporter 5→the pusher 33→the top ring 301A→the polishing table 300A→the pusher 33→the second transfer stage of the first linear transporter 5→the pusher 34→the top ring 301B→the polishing table 300B→the pusher 34→the third transfer stage of the first linear transporter 5→the lifter 35→the second transfer robot 40→the reversing machine 41→the transfer unit 46→the first cleaning device 42→the transfer unit 46→the second cleaning device 43→the transfer unit 46→the third cleaning device 44→the transfer unit 46→the fourth cleaning device 45→the first transfer robot 22→the wafer cassette of the front loading unit 20.

Another substrate is transferred on the following route: the wafer cassette of the front loading unit 20→the first transfer robot 22→the reversing machine 31→the lifter 32→the fourth transfer stage of the first linear transporter 5→the lifter 35→the second transfer robot 40→the lifter 36→the fifth transfer stage of the second linear transporter 6→pusher 37→the top ring 301C→the polishing table 300C→the pusher 37→the sixth transfer stage of the second linear transporter 6→the pusher 38→the top ring 301D→the polishing table 300D→the pusher 38→the seventh transfer stage of the second linear transporter 6→the lifter 36→the second transfer robot 40→the reversing machine 41→the transfer unit 46→the first cleaning device 42→the transfer unit 46→the second cleaning device 43→the transfer unit 46→the third cleaning device 44→the transfer unit 46→the fourth cleaning device 45→the first transfer robot 22→the wafer cassette of the front loading unit 20.

Figure 8:
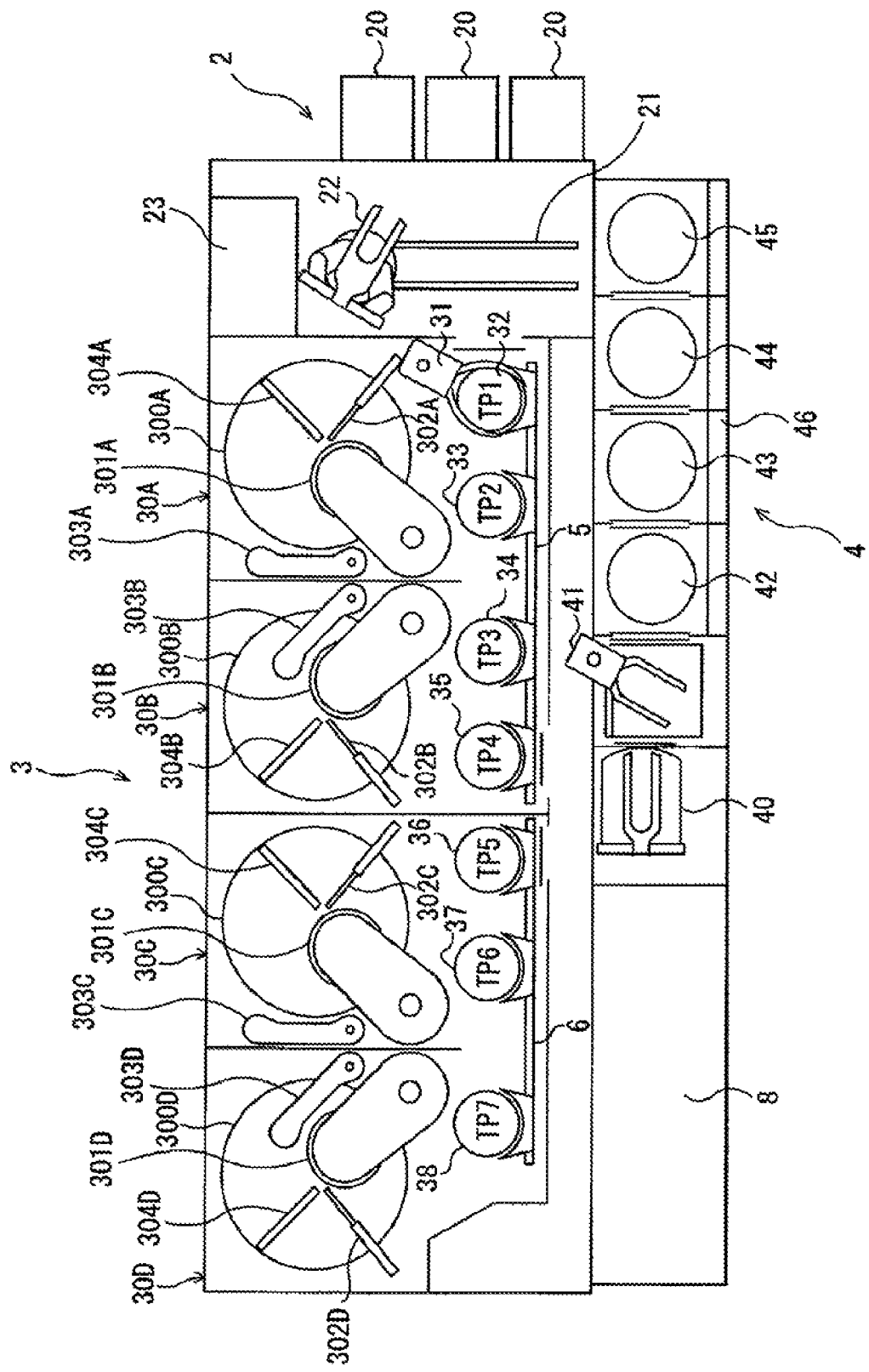
FIG. 8 is a plan view showing a whole structure of a polishing apparatus for performing a polishing method according to another embodiment of the present invention.
Figure 9:
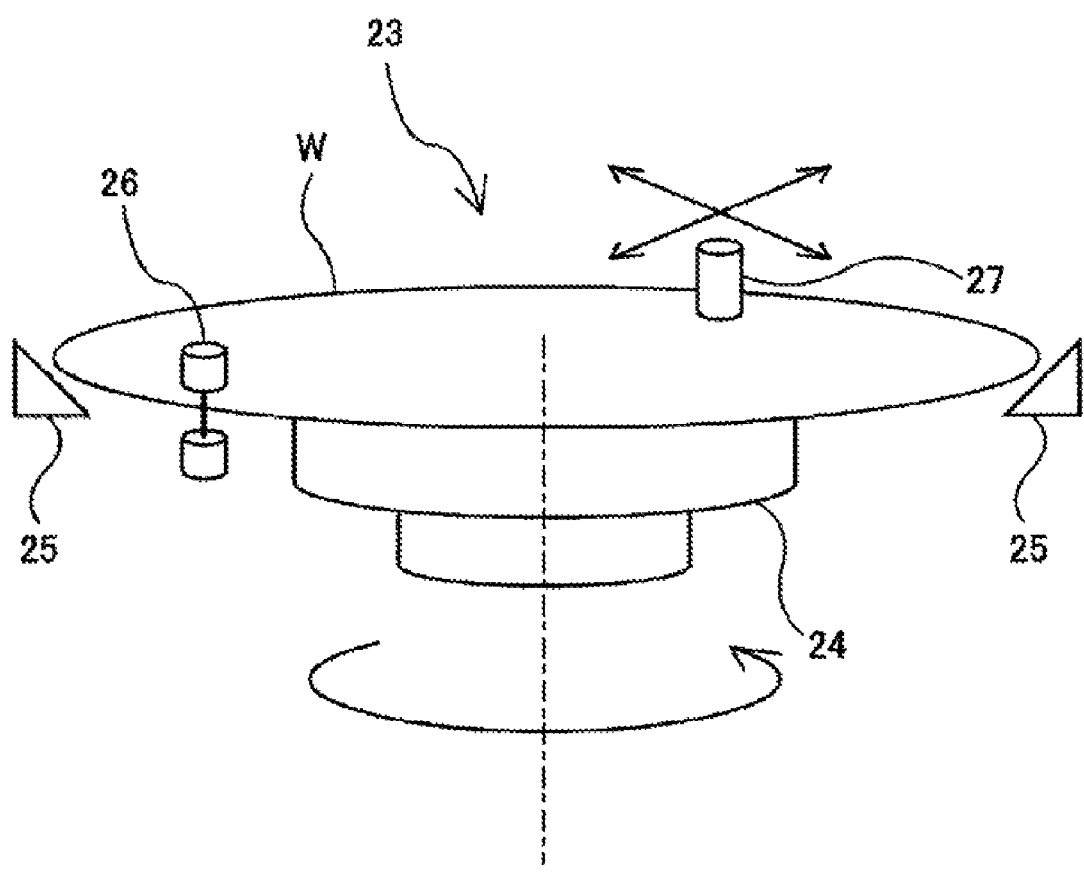
FIG. 9 is a schematic view showing a measuring station.

FIG. 8 is a plan view showing a whole structure of a polishing apparatus for performing a polishing method according to another embodiment of the present invention. A basic structure of the polishing apparatus shown in FIG. 8 is identical to that of the polishing apparatus shown in FIGS. 5, 6, 7, but is different in that an ex-situ measuring station 23 is provided next to the first transfer robot 22. This measuring station 23 is a device for measuring a film thickness of a polished substrate. FIG. 9 is a schematic view showing the measuring station. As shown in FIG. 9, the measuring station 23 includes a holding mechanism 24 configured to hold a substrate W via vacuum suction or the like and rotate the substrate W in a horizontal plane. The substrate W is held by the holding mechanism 24 with its polished surface facing upward.

The measuring station 23 has centering mechanisms (e.g., fingers) 25 arranged concentrically with the holding mechanism 24. The substrate W is transferred by the first transfer robot 22 into the measuring station 23 and is held by the centering mechanisms 25 once, whereby centering of the substrate W with respect to the holding mechanism 24 is conducted. After the centering operation, the substrate W is held by the holding mechanism 24. A notch detector 26 is provided near a periphery of the substrate W held by the holding mechanism 24. This notch detector 26 is configured to detect a notch of the substrate W using image processing or the like while the substrate W is rotated by the holding mechanism 24.

The measuring station 23 further includes an eddy current sensor 27 arranged so as to face the polished surface of the substrate W held by the holding mechanism 24. This eddy current sensor 27 is moved by a moving mechanism (not shown in the drawing) in a plane parallel to the surface of the substrate W. When the notch detector detects the notch, the holding mechanism 24 adjusts a position (angle) of the substrate W with respect to a rotational direction based on the position of the notch such that the notch faces a predetermined direction. Then, the eddy current sensor 27 measures a film thickness in a predetermined area on the polished surface of the substrate W. After measuring of the film thickness, the substrate W is transferred by the first transfer robot 22 to the wafer cassette of the front loading unit 20.

The substrate to be polished is a substrate having the insulating film with trenches, the barrier film formed on the insulating film, and the metal film formed on the barrier film, as shown in FIG. 1. Part of the metal film forms the metal interconnects in the trenches. The polishing process of the substrate is divided roughly into three processes: a metal film polishing process (a first polishing process), a barrier film polishing process (a second polishing process), and an insulating film and metal interconnects polishing process (a third polishing process).

As described above, when the hardmask film is being polished, the metal interconnects are also polished at the same time. Therefore, there is the interrelation between the output signal value of the in-situ eddy current sensor 312A in the third polishing process and the height of the metal interconnects (see the signal M3 in FIG. 3).

In this embodiment, the polishing end point is determined based on a polishing time. Specifically, the third polishing process is terminated when a predetermined polishing time has elapsed from a predetermined start point. The predetermined start point is a start point of one of the first polishing process, the second polishing process, and the third polishing process. The start point of the second polishing process is equivalent to the end point of the first polishing process. Since the first polishing process is a metal-film removing process, the start point of the second polishing process can be determined from the output signal value of the eddy current sensor 312A. Similarly, the start point of the third polishing process can also be determined from the output signal value of the eddy current sensor 312A, as described previously with reference to the graph in FIG. 3.

Generally, the barrier film, to be polished in the second polishing process, is relatively thin and has substantially a constant thickness. Accordingly, the end point of the second polishing process (i.e., the start point of the third polishing process) may be determined from a polishing time. All of the polishing processes from the first polishing process to the third polishing process can be determined from a polishing time. To detect the start points of the second polishing process and the third polishing process, the torque current of the polishing table, in addition to the output signal value of the in-situ eddy current sensor 312A, may be monitored.

After polishing in the polishing section 3, the substrate is delivered to the cleaning section 4, where the substrate is cleaned and dried. The dried substrate is transferred by the first transfer robot 22 to the ex-situ measuring station 23, where the height of the metal interconnects is measured by the eddy current sensor 27 (see FIG. 9). The measurement results are sent to the controller 8, and a polishing time for a subsequent substrate is adjusted by the controller 8 based on the measurement results.

Figure 10:
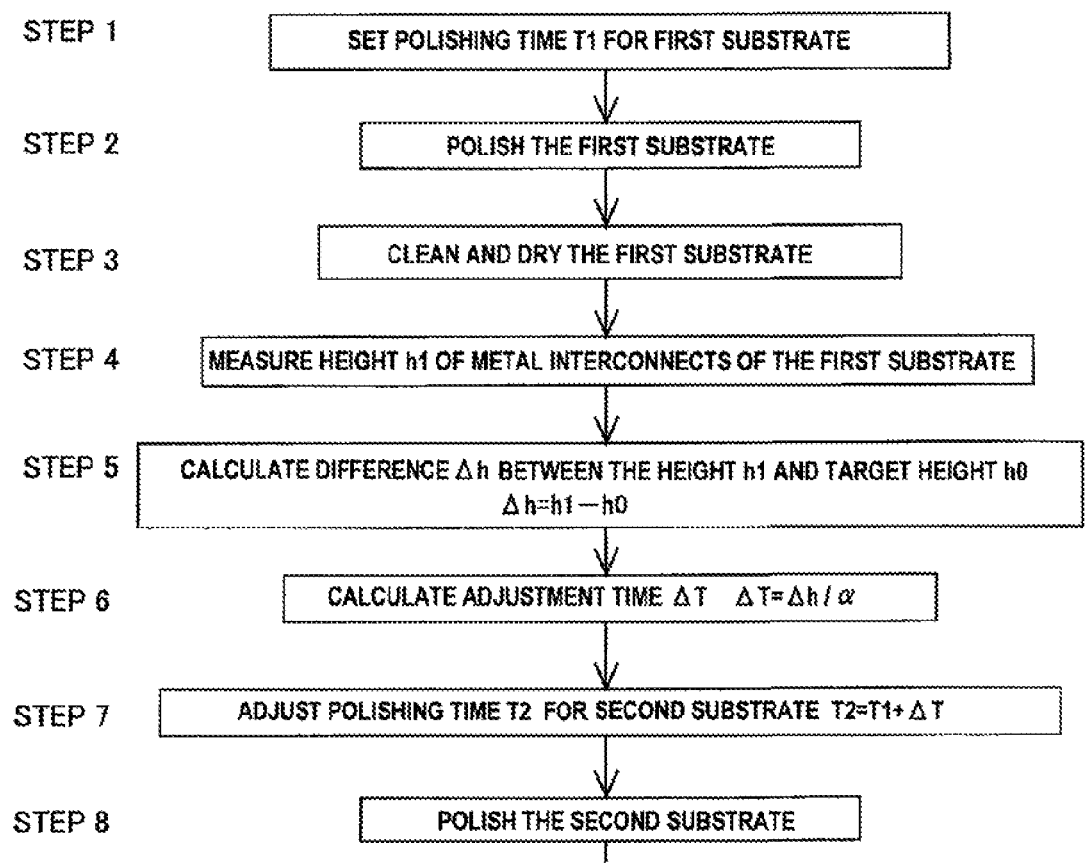
FIG. 10 is a flow chart illustrating adjustment of a polishing time for a subsequent substrate based on measurement results of a height of metal interconnects.

FIG. 10 is a flow chart illustrating adjustment of the polishing time for the subsequent substrate based on the measurement results of the height of the metal interconnects. In the following descriptions, a preceding substrate will be referred to as a first substrate, and a following substrate will be referred to as a second substrate. At step 1, a polishing time T1 of the first substrate (e.g., a first substrate of a lot) is set in the controller 8. This polishing time T1 is a polishing time of at least one of the first polishing process, the second polishing process, and the third polishing process. For example, in a case where the controller 8 is programmed to conduct polishing operations such that the polishing end point of the first polishing process is detected by the eddy current sensor 312A and the second polishing process and the third polishing process are performed for predetermined polishing times, the polishing time T1 is a total polishing time of the second polishing process and the third polishing process. On the other hand, in a case where the controller 8 is programmed to conduct polishing operations such that the first through third polishing processes are performed for predetermined polishing times, the polishing time T1 is a total polishing time of the first through third polishing processes. In this manner, the polishing time T1, which is a reference polishing time, is a polishing time of the polishing process(es) whose polishing end point is managed by a time. The polishing process(es) to be performed for the polishing time T1 is set in the controller 8 in advance.

Next, at step 2, the first substrate is polished through the first polishing process, the second polishing process, and the third polishing process. When polishing of the first substrate, the predetermined polishing process(es) that is set in advance in the controller 8 is performed for the polishing time T1. Then, at step 3, the polished first substrate is delivered to the cleaning section 4, where the first substrate is cleaned and dried. The dried first substrate is transferred to the measuring station 23, where a height h1 of the metal interconnects of the first substrate is measured (step 4). A measured area of the first substrate is an area in a predetermined fixed position. That is, a fixed-point measuring process is performed in the measuring station 23.

At step 5, a difference Δh between the height h1 of the metal interconnects measured and a preset target height h0 is calculated. This difference Δh is determined by subtracting the target height h0 from the height h1. Next, at step 6, an adjustment time ΔT is determined by dividing the difference Δh by a removal rate α of the first substrate. The removal rate α is given by using $$\alpha = (h\mathrm{Ini} - h0)/T \qquad (1)$$

where hIni is an initial height of interconnects of a sample substrate with identical structures, and T is a polishing time of the sample substrate. The initial height hIni may be a value measured when the barrier film is removed.

At step 7, a polishing time T2 (corresponding to the polishing time T1 of the first substrate) for the second substrate is adjusted by adding the adjustment time ΔT to the preset polishing time T1. Thereafter, the second substrate is polished. In polishing of the second substrate, the predetermined polishing process(es) that is set in the controller 8 in advance is performed for the polishing time T2. The polished second substrate is cleaned and dried in the cleaning section 4, as well as the first substrate. The polishing time T in the above equation (1) may be replaced with the adjusted polishing time (T2, T3, . . . ) successively.

If necessary, the height of the metal interconnects of the dried second substrate may be measured in the measuring station 23, and a polishing time for another substrate that follows the second substrate may be adjusted in the same way as described above. In this case, the height of the metal interconnects in the same area as the measured area of the first substrate is measured. The second substrate may not be a substrate that follows right after the first substrate. Several substrates may be polished between the first substrate and the second substrate. In this case, the predetermined polishing process(es) of the substrates to be polished between the first substrate and the second substrate is performed for the polishing time T1.

In order to precisely measure the height of the metal interconnects, it is preferable to establish in advance a relationship between the output signal value of the eddy current sensor 27 of the measuring station 23 and the height of the metal interconnects. The relationship between the output signal value of the eddy current sensor 27 and the height of the metal interconnects can be determined from measurement results obtained by polishing one or more sample substrate with an identical structure and measuring a height of metal interconnects of the polished sample substrate with the eddy current sensor 27. In this embodiment, since the ex-situ measuring station 23 is used, the height of the metal interconnects is measured after drying of the substrate. Therefore, the polishing liquid and the rinsing liquid do not affect the measuring process, and as a result an accurate height of the metal interconnects can be measured. A metal film dedicated for measurement with the same height as that of the metal interconnects may be formed on the substrate, and a height of this metal film may be measured instead of the height of the metal interconnects. This metal film dedicated for measurement is formed as a bulk film that is to be polished together with the metal interconnects and the hardmask film. The metal film dedicated for measurement is formed in the above-described predetermined fixed position, and the fixed-point measuring process is performed by the measuring station 23.

Generally, the measurement of the metal interconnects is affected by interconnect patterns. This is because the output signal value of the eddy current sensor can vary depending not only on the height of the metal interconnects, but also on the interconnect density. In addition, in a multilayer interconnect structure, the eddy current sensor reacts not only to the metal interconnects that are a measuring target, but also to metal interconnects in a lower level. In order to reduce such effects of the interconnect patterns and the metal interconnects in the lower level, the height of the metal interconnects in the predetermined area (in the fixed or constant position) is measured. Accordingly, by obtaining beforehand a relationship between the output signal value of the eddy current sensor and the height of the metal interconnects in that predetermined area, an accurate height of the metal interconnects can be measured.

Next, still another embodiment of the present invention will be described.

Figure 11:
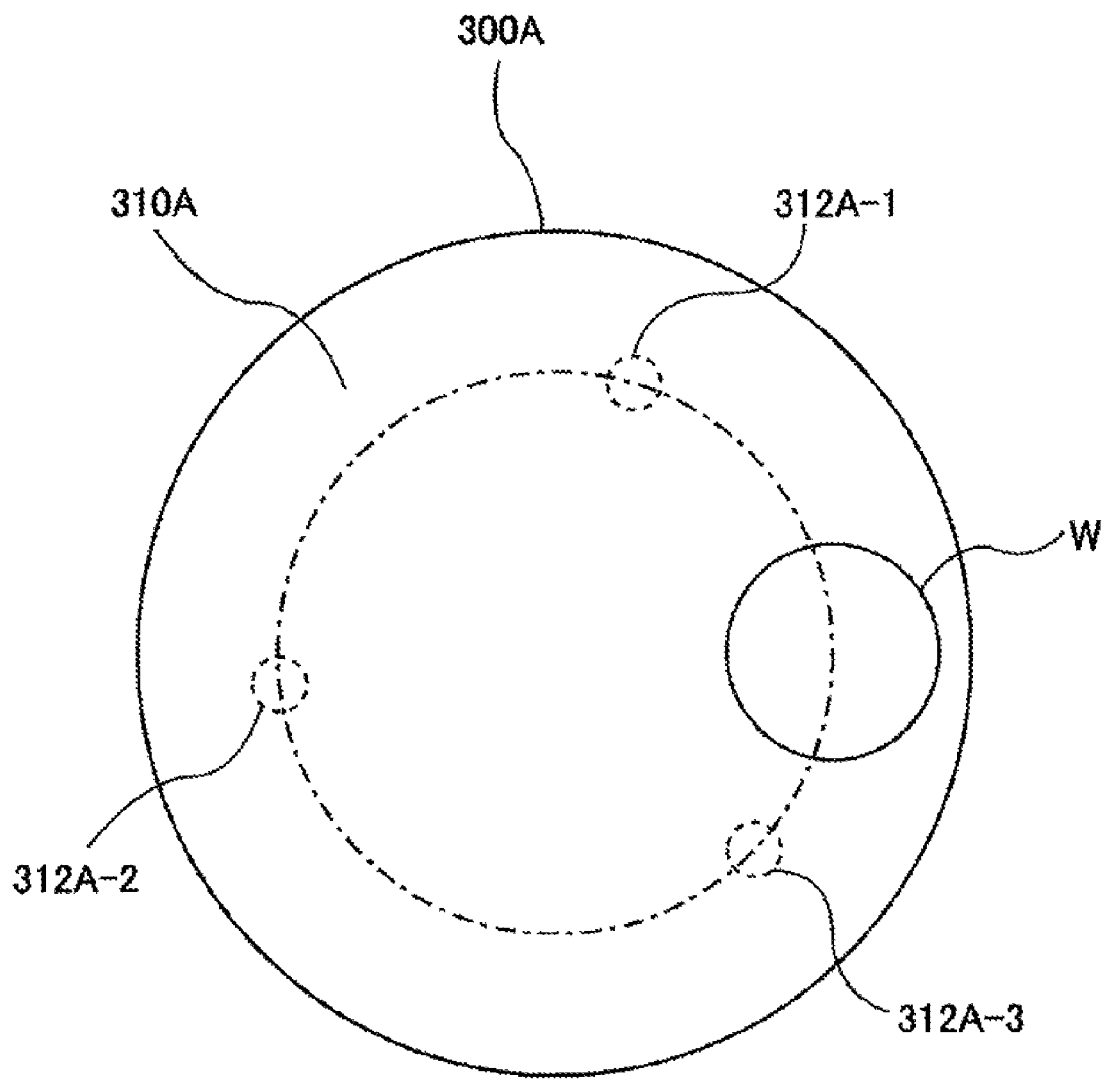
FIG. 11 is a plan view showing a polishing table used in another embodiment of the present invention.

In this embodiment, an in-situ eddy current sensor is used to monitor a polishing state (progress of polishing) of a substrate during polishing thereof. More specifically, the first polishing process, the second polishing process, and the third polishing process are monitored by least one eddy current sensor with different sensitivities. FIG. 11 is a plan view showing the polishing table used in this embodiment. As shown in FIG. 11, plural (three in FIG. 11) eddy current sensors 312A-1, 312A-2, 312A-3 are embedded in the polishing table 300A. These eddy current sensors 312A-1, 312A-2, 312A-3 are located in positions so as to travel through the center of the substrate W as the polishing table 300A rotates.

The eddy current sensors 312A-1, 312A-2, 312A-3 have different sensitivities. During polishing of the substrate W, these eddy current sensors 312A-1, 312A-2, 312A-3 are selectively used to monitor the polishing state (the progress of polishing) of the substrate W. More specifically, the eddy current sensor 312A-3 having highest sensitivity is used to monitor the polishing state during the third polishing process, and the eddy current sensor 312A-1 and/or the eddy current sensor 312A-2 having lower sensitivity than that of the eddy current sensor 312A-3 is used to monitor the polishing state during the second and first polishing processes. This is because a layer to be polished in the third polishing process is a mixture of the insulating film and the metal interconnects and has a high resistance.

In this embodiment, the polishing operation is terminated when an output signal value of selected one of the eddy current sensors 312A-1, 312A-2, 312A-3 reaches a predetermined threshold. This threshold is stored in the controller 8 in advance, and the controller 8 determines the polishing end point. In this embodiment, because the eddy current sensor having high sensitivity is used to monitor the polishing progress during the third polishing process, an accurate polishing end point can be detected.

It is preferable that the eddy current sensor 312A-3 used in the third polishing process has higher sensitivity than that of the eddy current sensor 312A-2 used in the second polishing process and that the eddy current sensor 312A-2 used in the second polishing process has higher sensitivity than that of the eddy current sensor 312A-1 used in the first polishing process. The number of eddy current sensors is not limited to this example, as long as two or more eddy current sensors are provided.

The eddy current sensors 312A-1, 312A-2, 312A-3 are designed to differ in at least one of a frequency of an alternating current applied to a sensor coil, the number of turns of a sensor coil, a diameter of the sensor coil, an amplification factor of electrical signal in the eddy current sensor, an adjustment signal range, and a distance between a polishing target surface of a substrate and the sensor coil. The adjustment signal range is an analog-to-digital conversion range, i.e., a range of an analog signal value to be converted into a digital signal. Instead of plural eddy current sensors with different sensitivities, a single eddy current sensor having different sensitivity levels which can be switched from one to another may be used. In this case, the sensitivity levels can be switched by changing the frequency of the alternating current applied to the sensor coil, the amplification factor of electrical signal in the eddy current sensor, or the adjustment signal range.

Next, still another embodiment of the present invention will be described.

As with the above embodiments, an in-situ eddy current sensor is used to monitor a polishing state (progress of polishing) of a substrate during polishing thereof. The polishing operation is terminated when the output signal value reaches a predetermined threshold. Arrangement of the eddy current sensor is identical to the arrangement shown in FIG. 7. In this embodiment, the eddy current sensor has an effective measuring area that is wide enough to fully cover at least one chip (device) formed on the substrate.

Figure 12:
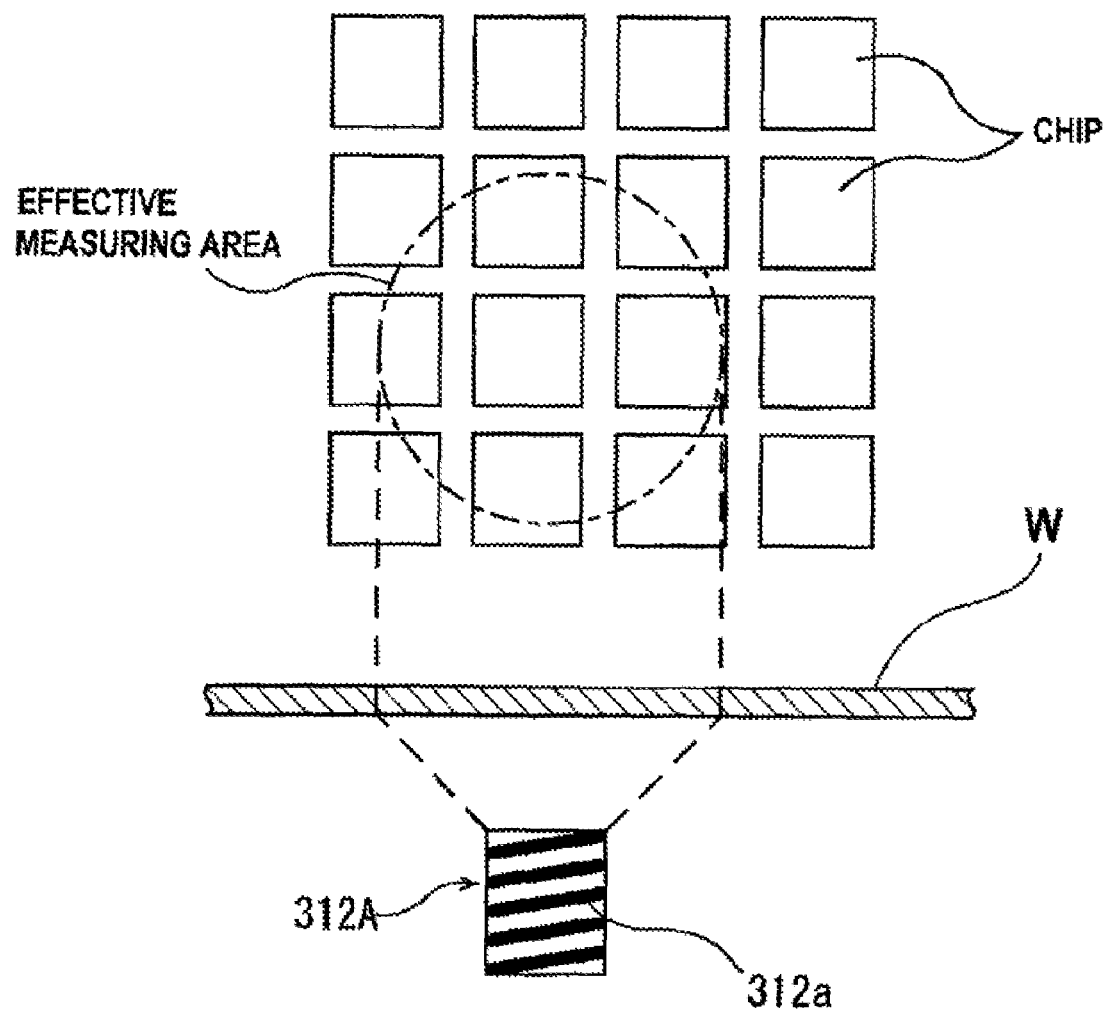
FIG. 12 is a schematic view showing an effective measuring area of an eddy current sensor according to still another embodiment of the present invention.

FIG. 12 is a schematic view showing the effective measuring area of the eddy current sensor according to the embodiment of the present invention. As shown in FIG. 12, the effective measuring area of the eddy current sensor 312A is larger than an area of one chip and fully covers the chip. This effective measuring area varies depending on a diameter of a sensor coil 312a of the eddy current sensor 312A and a distance between the sensor coil 312a and the substrate. Therefore, by adjusting the diameter of the sensor coil 312a and/or the distance between the sensor coil 312a and the substrate, the effective measuring area of the eddy current sensor 312A can be larger than a chip on the substrate. The sensitivity of the eddy current sensor 312A itself can be increased by using a sensor coil with a larger diameter. A preferable effective measuring area is in a range of 20 mm to 300 mm (expressed as a diameter thereof).

In the above-described embodiments, the hardmask film formed on the interlevel dielectric is polished. Some substrates may have a barrier film formed directly on the interlevel dielectric without the hardmask film. In such substrates, a multilayer structure is formed by polishing the metal film, the barrier film, and the interlevel dielectric. The present invention can also be applied to such a substrate.

In order to improve an accuracy of measuring of the height of the metal interconnects, it is preferable to use the following techniques.

A first technique is to correct the output signal value of the eddy current sensor. The output signal value of the eddy current sensor can be changed by some causes including an ambient temperature of the eddy current sensor, a change in operating conditions (e.g., liquid permeation into a polishing pad), and a change in the eddy current sensor itself with time. Accordingly, it is preferable to correct the change in the output signal value itself of the eddy current sensor. The signal value can be corrected through correcting process including the steps of obtaining, as a correction signal value, a signal value of the eddy current sensor under a predetermined condition at an appropriate timing during, before or after polishing of the substrate, subtracting a predetermined correction reference value from the correction signal value to determine a correction amount, and subtracting the correction amount from the output signal value (actual measurement of the film thickness) of the eddy current sensor. The correction reference value is an output signal value of the eddy current sensor obtained in advance under the same condition as that when the correction signal value is obtained.

A second technique is to make the thickness of the metal film or the barrier film uniform prior to polishing the metal interconnects. In polishing of a substrate, it is not always the case that the polishing process progresses while maintaining a uniform film thickness over the surface of the substrate. For example, polishing of a central portion of the substrate may proceed faster than polishing of a periphery of the substrate, or polishing of the periphery of the substrate may proceed faster than polishing of the central portion. Such non-uniform film thickness over the polished surface of the substrate can cause a variation in start timing of polishing of the insulating film within the surface of the substrate, resulting in a variation in height of the metal interconnects and causing an adverse effect on measuring of the height of the metal interconnects. Thus, it is preferable to polish the metal film or the barrier film prior to the third polishing process, i.e., in the first or second polishing process, so as to provide the metal film or the barrier film with a uniform thickness over the surface of the substrate. Specifically, it is preferable to use a top ring having plural pressing mechanisms arranged concentrically, as shown in FIG. 13.

Figure 13:
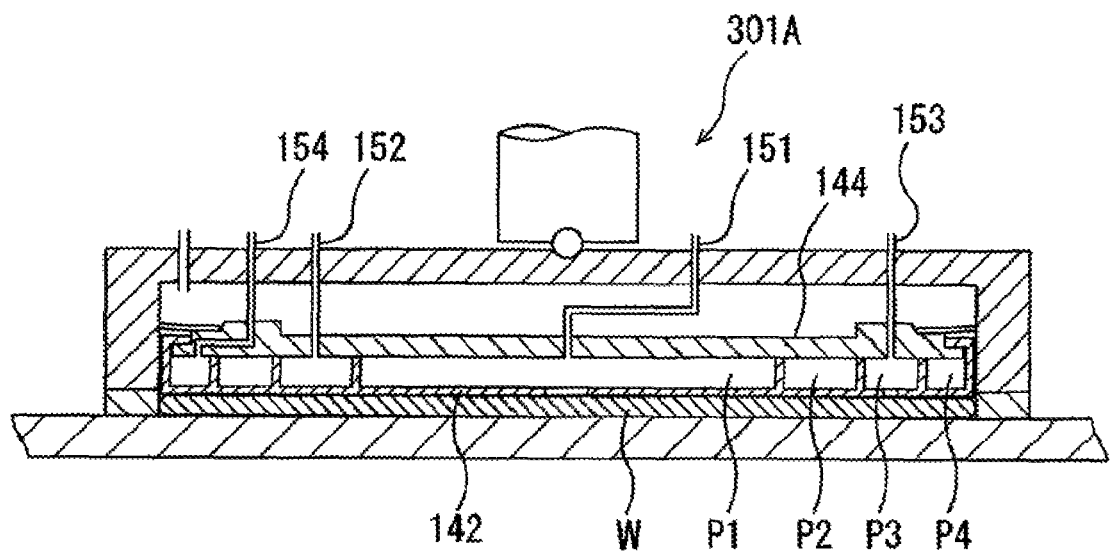
FIG. 13 is a cross-sectional view schematically showing a modified example of a top ring.

FIG. 13 is a cross-sectional view schematically showing a modified example of the top ring 301A. The top ring 301A has an elastic pad 142 arranged to be brought into contact with the substrate W, and a chucking plate 144 configured to hold the elastic pad 142. The elastic pad 142 has an upper peripheral edge, which is held by the chucking plate 144. Four pressure chambers (air bags) P1, P2, P3, and P4 are provided between the elastic pad 142 and the chucking plate 144. A pressurized fluid (e.g., a pressurized air) is supplied into the pressure chambers P1, P2, P3, and P4 or a vacuum is developed in the pressure chambers P1, P2, P3, and P4 via fluid passages 151, 152, 153, and 154, respectively. The center pressure chamber P1 has a circular shape, and the other pressure chambers P2, P3, and P4 have an annular shape. These pressure chambers P1, P2, P3, and P4 are in a concentric arrangement.

A pressure-adjusting device (not shown in the drawing) is provided so as to change internal pressures of the pressure chambers P1, P2, P3, and P4 independently of each other to thereby independently adjust pressing forces to be applied to four zones: a central zone, an inner middle zone, an outer middle zone, and a peripheral zone. In this example, the pressure chambers P1, P2, P3, and P4 constitute the pressing mechanisms for independently pressing the substrate W. During polishing, the film thickness is measured by the eddy current sensor 312A (see FIG. 7), and a film-thickness distribution with respect to a radial direction of the substrate W is obtained by the controller 8. The controller 8 regulates the internal pressures of the pressure chambers P1, P2, P3, and P4 according to the film-thickness distribution, whereby the substrate W is polished to have a planarized surface.

Figure 14:
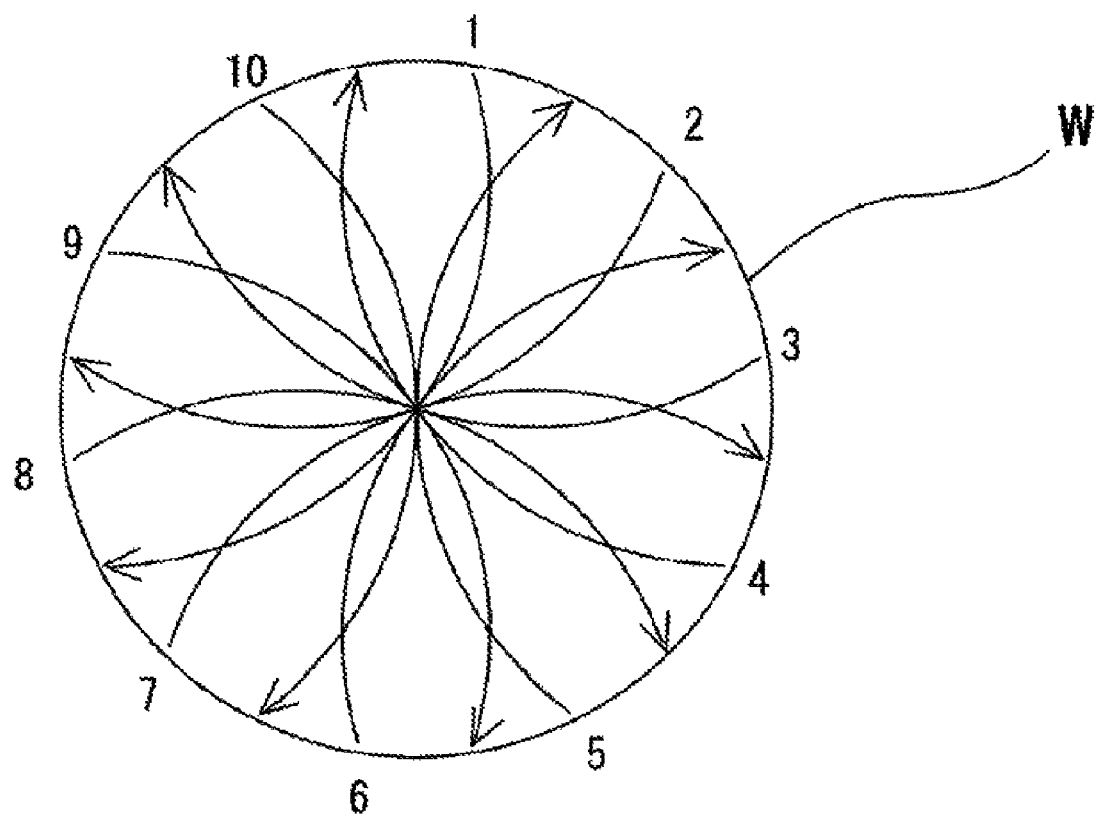
FIG. 14 is a view showing paths of the eddy current sensor.

A third technique is to adjust a rotational speed ratio between the top ring and the polishing table such that paths of the in-situ eddy current sensor are distributed substantially evenly over the circumference of the surface of the substrate. Generally, it is difficult to completely remove an effect of the interconnect patterns on measurements. Thus, by adjusting the rotational speed ratio between the top ring and the polishing table, the eddy current sensor can scan the surface of the substrate at substantially equal interval with respect to the circumferential direction of the substrate, as shown in FIG. 14. An average value of the measurements obtained in a predetermined period of time is calculated, and this average value is used as the measurement for the surface of the substrate in its entirety. By measuring the entire surface of the substrate evenly and calculating the average value of the measurements, the effect of the interconnect patters can be reduced.

A fourth technique is to provide an eddy current sensor in a center of the top ring. The center of the top ring corresponds substantially to the center of the substrate. Therefore, the eddy current sensor provided in the top ring can measure a film thickness at a fixed-point of the substrate, i.e., at the center of the substrate. Consequently, an accurate polishing end point can be detected without the effect of the interconnect patterns.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. A method of polishing a substrate having an insulating film, a barrier film formed on the insulating film, and a metal film formed on the barrier film, a part of the metal film forming metal interconnects, said method comprising:
    performing a first polishing process of removing the metal film;
    after the first polishing process, performing a second polishing process of removing the barrier film;
    after the second polishing process, performing a third polishing process of polishing the insulating film and the metal film simultaneously;
    during the second polishing process and the third polishing process, monitoring a polishing state of the substrate with an eddy current sensor; and
    terminating the third polishing process when an output signal of the eddy current sensor reaches a predetermined threshold, wherein
    the predetermined threshold is a value determined by subtracting a predetermined value from a value of the output signal of the eddy current sensor at a time of an end point of the second polishing process, and
    the predetermined value is a value of a variation in the output signal value of the eddy current sensor which corresponds to a predetermined amount of the insulating film to be polished.

2. The method according to claim 1, wherein:
    said performing of the first polishing process, said performing of the second polishing process, and said performing of the third polishing process each comprises holding the substrate with a substrate holder and pressing the substrate against a polishing surface of a polishing pad on a polishing table while rotating the substrate holder and the polishing table; and
    the end point of the second polishing process is determined by monitoring the output signal value of the eddy current sensor and at least one of a temperature of the polishing surface, a torque current of the polishing table, and a torque current of the substrate holder.

3. The method according to claim 1, further comprising:
    during the second polishing process, monitoring the polishing state of the substrate with an optical sensor,
    wherein the end point of the second polishing process is determined from changing points of the output signal value of the eddy current sensor and an output signal value of the optical sensor.

4. The method according to claim 1, further comprising:
    adjusting a selective ratio of slurry to be used as a polishing liquid in the first polishing process, the second polishing process, and the third polishing process such that an upper surface of the metal film and an upper surface of the insulating film lie in a same plane when the third polishing process is terminated.

* * * * *